(12) United States Patent
Li et al.

(10) Patent No.: US 11,025,139 B2
(45) Date of Patent: Jun. 1, 2021

(54) MOTOR

(71) Applicant: Johnson Electric International AG, Murten (CH)

(72) Inventors: Yue Li, Hong Kong (CN); Youqing Xiang, Shenzhen (CN); Xiaojun Yan, Shenzhen (CN); Minghua Xiong, Shenzhen (CN); Bailin Bo, Shenzhen (CN); Zhanqi Zhang, Shenzhen (CN); Qingliang Lang, Shenzhen (CN); Yun Chen, Shenzhen (CN); Jian Zhao, Shenzhen (CN); Yanfei Liao, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 279 days.

(21) Appl. No.: 16/178,414

(22) Filed: Nov. 1, 2018

(65) Prior Publication Data

US 2019/0131852 A1 May 2, 2019

(30) Foreign Application Priority Data

Nov. 1, 2017 (CN) .......................... 201711058864.9

(51) Int. Cl.
  *H02K 9/22* (2006.01)
  *B60K 11/06* (2006.01)
  *H05K 1/02* (2006.01)
  *H02K 7/00* (2006.01)
  *H02K 11/33* (2016.01)
  (Continued)

(52) U.S. Cl.
  CPC ................ *H02K 9/22* (2013.01); *B60K 11/06* (2013.01); *H02K 1/148* (2013.01); *H02K 1/2786* (2013.01); *H02K 7/006* (2013.01); *H02K 7/14* (2013.01); *H02K 11/33* (2016.01); *H05K 1/0209* (2013.01); *H02K 2211/03* (2013.01)

(58) Field of Classification Search
  CPC .......... H02K 9/22; H02K 11/33; H02K 11/30; H02K 2211/03; H02K 2203/03
  See application file for complete search history.

(56) References Cited

U.S. PATENT DOCUMENTS 7,445,081 B2 * 11/2008 Tominaga ............ B62D 5/0406
                                                180/444
7,557,442 B2 *  7/2009 Licht ................... H01L 23/3675
                                                257/675

(Continued)

FOREIGN PATENT DOCUMENTS

CN       1093861 A      10/1994
JP     2017-207793   *  10/2017

OTHER PUBLICATIONS

English Machine Translation of CN1093861A same document as reference.

*Primary Examiner* — Robert W Horn
(74) *Attorney, Agent, or Firm* — Millman IP Inc.

(57) ABSTRACT

A motor includes a stator, a rotor rotatable relative to the stator, a circuit board fixed to the stator, and a heat sink disposed on the circuit board, a side surface of the circuit board facing the heat sink has an insulating region and a metal heat dissipation region without solder mask. The thermal resistance between the circuit board and the heat sink can be reduced by the metal heat dissipation region, thereby improving the heat dissipation of the circuit board.

11 Claims, 8 Drawing Sheets

(51) Int. Cl.
*H02K 7/14* (2006.01)
*H02K 1/27* (2006.01)
*H02K 1/14* (2006.01)

(56) References Cited

U.S. PATENT DOCUMENTS

| | | | | |
|---|---|---|---|---|
| 7,732,917 | B2* | 6/2010 | Saito | H01L 25/18 |
| | | | | 257/712 |
| 9,270,145 | B2* | 2/2016 | Asao | H02K 11/30 |
| 9,359,004 | B2* | 6/2016 | Kawata | H02P 25/22 |
| 9,457,835 | B2* | 10/2016 | Yamasaki | H02K 11/33 |
| 9,479,025 | B2* | 10/2016 | Kawata | H02K 11/20 |
| 9,685,837 | B2* | 6/2017 | Park | H02K 11/20 |
| 9,879,596 | B1* | 1/2018 | Bogen | H02K 7/116 |
| 9,978,672 | B1* | 5/2018 | Ahlers | H01L 23/49503 |
| 10,050,493 | B2* | 8/2018 | Kabune | B62D 5/0412 |
| 10,063,121 | B2* | 8/2018 | Nakamura | H02K 5/10 |
| 10,208,853 | B2* | 2/2019 | Roos | H02K 5/225 |
| 10,236,791 | B1* | 3/2019 | Chung | H05K 7/20945 |
| 10,326,337 | B2* | 6/2019 | Omura | B25F 5/008 |
| 10,374,490 | B2 | 8/2019 | Yamamoto et al. | |
| 10,389,211 | B2* | 8/2019 | Bradfield | H02K 9/22 |
| 10,424,994 | B2* | 9/2019 | Kabune | H02K 11/30 |
| 10,461,611 | B2* | 10/2019 | Hieda | H02K 9/22 |
| 10,604,173 | B2* | 3/2020 | Okamura | H05K 5/0047 |
| 10,638,595 | B2* | 4/2020 | Falkenburger | H02K 11/33 |
| 10,749,414 | B2* | 8/2020 | Ito | H02M 5/458 |
| 2004/0217465 | A1* | 11/2004 | Stolze | H01L 23/16 |
| | | | | 257/706 |
| 2014/0054991 | A1* | 2/2014 | Hyodo | F04C 15/008 |
| | | | | 310/71 |
| 2015/0171709 | A1* | 6/2015 | Ito | H02K 9/22 |
| | | | | 310/52 |
| 2016/0020676 | A1* | 1/2016 | Omura | B24B 23/028 |
| | | | | 310/50 |
| 2016/0079822 | A1* | 3/2016 | Noguchi | F04D 13/06 |
| | | | | 310/71 |
| 2016/0111940 | A1* | 4/2016 | Oyama | F04D 25/0646 |
| | | | | 417/423.7 |
| 2017/0288507 | A1* | 10/2017 | Otsuka | F04D 25/068 |
| 2018/0245597 | A1* | 8/2018 | Takarai | H02K 3/325 |
| 2018/0248451 | A1* | 8/2018 | Hagiwara | G01L 5/221 |
| 2018/0254685 | A1* | 9/2018 | Seki | F04C 2/10 |
| 2018/0301959 | A1* | 10/2018 | Wettlaufer | H02K 5/10 |
| 2019/0131852 | A1* | 5/2019 | Li | H02K 7/14 |
| 2019/0140520 | A1* | 5/2019 | Sato | H02K 9/22 |
| 2019/0267873 | A1 | 8/2019 | Yin et al. | |
| 2019/0273416 | A1* | 9/2019 | Kizu | H02K 3/04 |
| 2019/0276072 | A1* | 9/2019 | Morimoto | H01G 9/26 |
| 2019/0313549 | A1* | 10/2019 | Fujita | H02K 11/33 |
| 2019/0386547 | A1* | 12/2019 | Im | H05K 1/0203 |
| 2020/0021168 | A1* | 1/2020 | Aso | H02K 5/08 |
| 2020/0079420 | A1* | 3/2020 | Takada | H02K 11/215 |
| 2020/0100393 | A1* | 3/2020 | Xiang | H05K 1/0209 |
| 2020/0313515 | A1* | 10/2020 | Hattori | H02K 5/10 |

\* cited by examiner

MOTOR

CROSS REFERENCE TO RELATED APPLICATIONS

This non-provisional patent application claims priority under 35 U.S.C. § 119(a) from Patent Application No. 201711058864.9 filed in The People's Republic of China on Nov. 1, 2017.

FIELD OF THE INVENTION

The present disclosure relates to electric motors, and in particular to a motor of a car engine cooling fan.

BACKGROUND OF THE INVENTION

In a cooling fan of an automobile engine, an outer rotor brushless motor is often used to drive the impeller of the cooling fan. The impeller includes a hub and blades extending outward from the hub, and the outer rotor brushless motor is mounted in the hub. The outer rotor of the motor is fixedly connected with the hub, and the outer rotor rotates to drive the impeller to rotate.

A conventional outer rotor brushless motor for a cooling fan includes a circuit board and a heat sink, and the surface of the circuit board is covered by the solder mask, thereby increasing the thermal resistance between the circuit board and the heat sink.

SUMMARY OF THE INVENTION

Hence there is a desire for a new motor having improved heat dissipation effect.

Accordingly, in one aspect thereof, the present disclosure provides a motor including a stator, a rotor rotatable relative to the stator, a circuit board fixed to the stator, and a heat sink disposed on the circuit board. A side surface of the circuit board facing the heat sink includes an insulating region and a metal heat dissipation region without solder mask.

Preferably, the material of the insulating region is solder resist ink, and the material of the metal heat dissipation region is nickel gold or tin.

Preferably, the circuit board is a two-layer circuit board or a four-layer circuit board, and the circuit board includes an inverter circuit. The inverter circuit includes a plurality of switching transistors mounted on a surface of the circuit board opposite to the side surface facing the heat sink, and the metal heat dissipation region is under the plurality of switching transistors.

Preferably, a heat conducting sheet is disposed between the heat sink and the metal heat dissipation region of the circuit board.

Preferably, the circuit board includes an inverter circuit, the inverter circuit includes at least two pairs of switching transistors, and each pair of the switching transistors is integrated in one semiconductor package.

Preferably, at least one capacitor and/or an inductor are mounted on the circuit board, one end of the at least one capacitor and/or the inductor is mounted to the circuit board, the other end of the at least one capacitor and/or the inductor extends into the stator and overlaps with stator windings in an axial direction.

Preferably, the heat sink includes a receiving portion that extends into an interior of the stator, and the at least one capacitor and/or the inductor are received in the receiving portion.

Preferably, the stator core is fixed to the heat sink via an injection molded member.

Preferably, the motor is an outer rotor brushless motor, a bearing of the motor is supported by the heat sink, and the stator and the circuit board are respectively disposed on two sides of the heat sink.

In another aspect thereof, the present disclosure provides a motor including a stator, a rotor rotatable relative to the stator, and a circuit board fixed to the stator. The circuit board includes at least one capacitor and/or an inductor, one end of the at least one capacitor and/or the inductor being is mounted to the circuit board, the other end of the capacitor and/or the inductor extends into an interior of the stator so as to overlap windings of the motor in an axial direction.

Preferably, the motor includes a heat sink fixed to the stator, the heat sink has a heat dissipation plate, a bearing housing is formed on the heat dissipation plate, a supporting wall configured for supporting the stator is arranged around the bearing housing, the bearing housing and the supporting wall are partially connected in the circumferential direction through a connecting plate. The radially outer surface of the bearing housing, the radially inner surface of the supporting wall, and the axial inner surface of the connecting plate together form a housing portion with the at least one capacitor and/or the inductor received therein, and the housing portion protrudes into an interior of the stator.

In the embodiments of the present disclosure, the metal heat dissipation region is disposed on the side surface of the circuit board facing the heat sink, which can reduce thermal resistance between the circuit board and the heat sink, thereby improving heat dissipation effect of the circuit board. In addition, each pair of switching transistors of the inverter circuit is integrated in one semiconductor package, which is lower in cost than using a separate package for each transistor, and the length of the power line in the circuit board is shortened, which reduces the electromagnetic interference of the power line and makes the motor operation more stable and reliable. Further, the large-size capacitor and/or the large-size inductor on the circuit board extend into the stator to reduce the axial height of the motor.

BRIEF DESCRIPTION OF THE DRAWINGS

A preferred embodiment of the disclosure will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
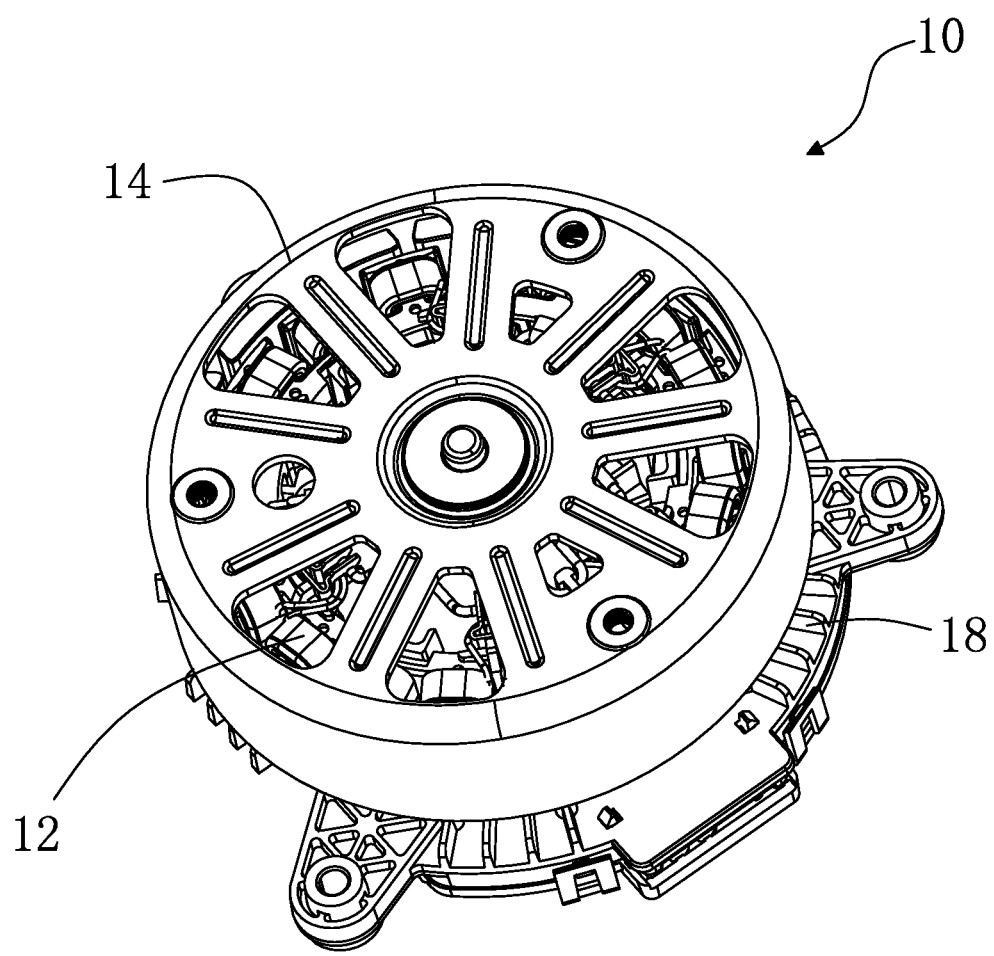
FIG. 1 shows a motor in accordance with an embodiment of the present disclosure.

The technical solutions in embodiments of the present disclosure are described clearly and completely hereinafter in conjunction with the drawings in embodiments of the present disclosure. Apparently, the described embodiments are only some rather than all of the embodiments of the invention. All other embodiments obtained by those skilled in the art based on the embodiments of the present disclosure without any creative effort fall within the protection scope of the present disclosure. It can be understood that, the drawings are merely for reference and illustration, not to limit the invention. In the drawings, a displayed connection is merely for clear description, not to limit a connection manner.

It should be noted that, when a component is considered to be "connected" to another component, it may be directly connected to another component, or there may be an intermediate component. Unless otherwise defined, all the technical and scientific terms used herein have the same meaning as commonly understood by those skilled in the art to which the invention belongs. The terms used in the present disclosure are merely for describing specific embodiments, not to limit the invention.

Figure 2:
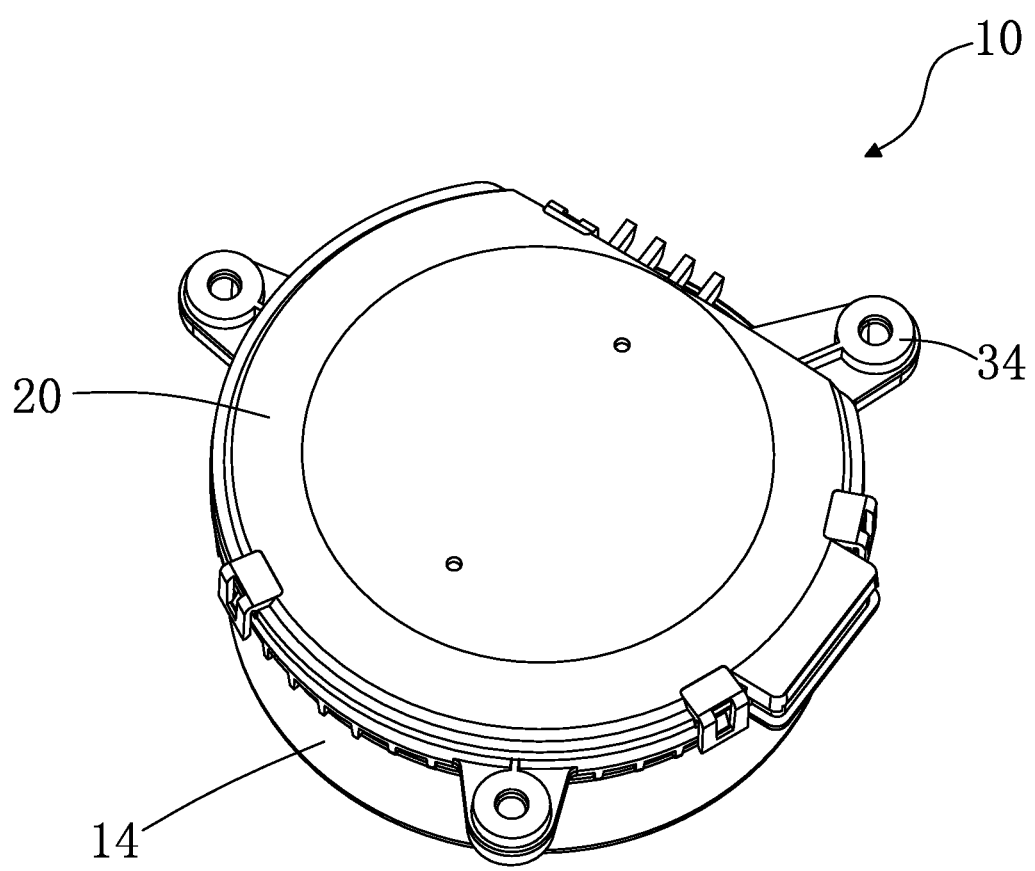
FIG. 2 is a bottom view of the motor of FIG. 1.
Figure 3:
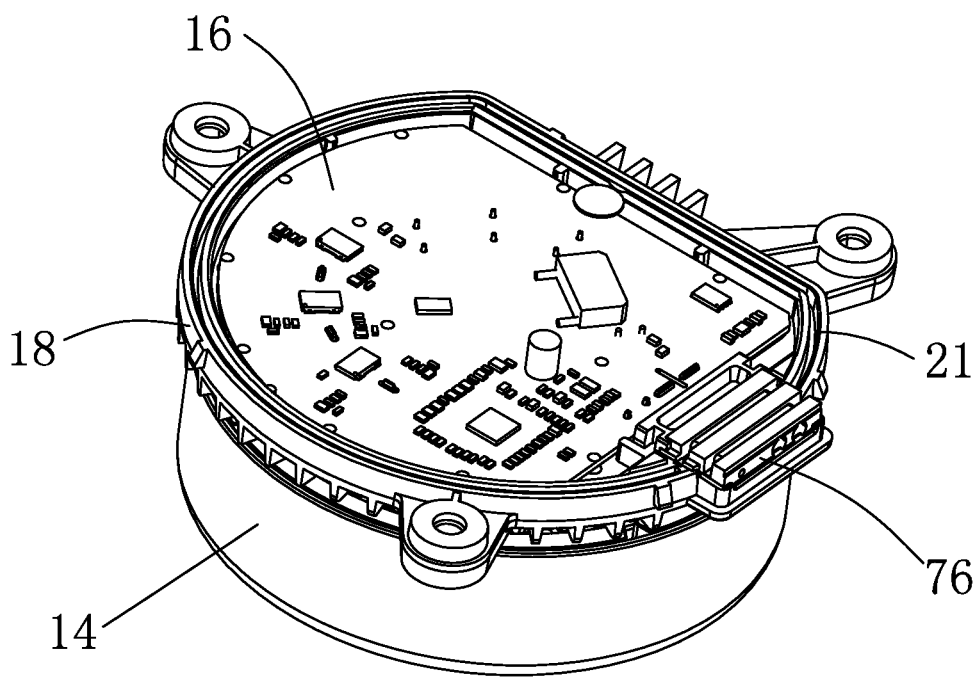
FIG. 3 shows the motor of FIG. 2 with the cover removed.

FIGS. 1 to 3 illustrate a motor 10 in accordance with one embodiment of the present disclosure. In this embodiment, an outer rotor type three-phase brushless DC motor is described as an example. The motor 10 is particularly suitable for a cooling fan of an automobile engine, and is of course not limited thereto. The motor 10 includes a stator 12, a rotor 14, a circuit board 16, a heat sink 18, and a cover 20. The rotor 14 rotates circumferentially around the stator 12, the cover 20 and the stator 12 are respectively fixed to the two sides of the heat sink 18, and the circuit board 16 is disposed between the heat sink 18 and the cover 20.

Figure 4:
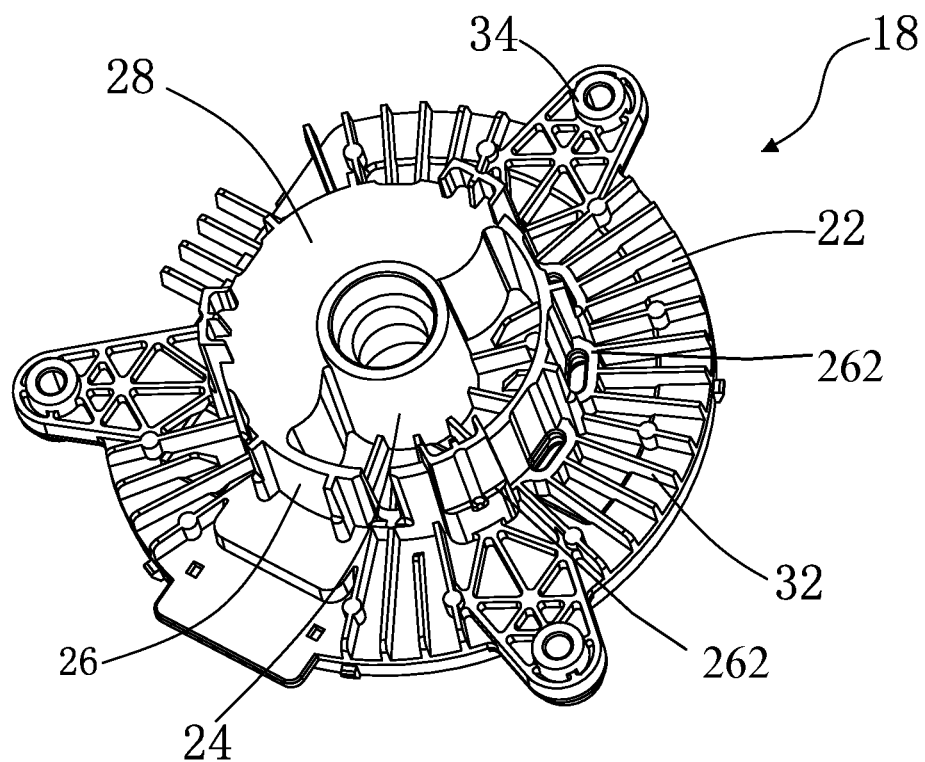
FIG. 4 shows the heat sink of the motor of FIG. 1.
Figure 5:
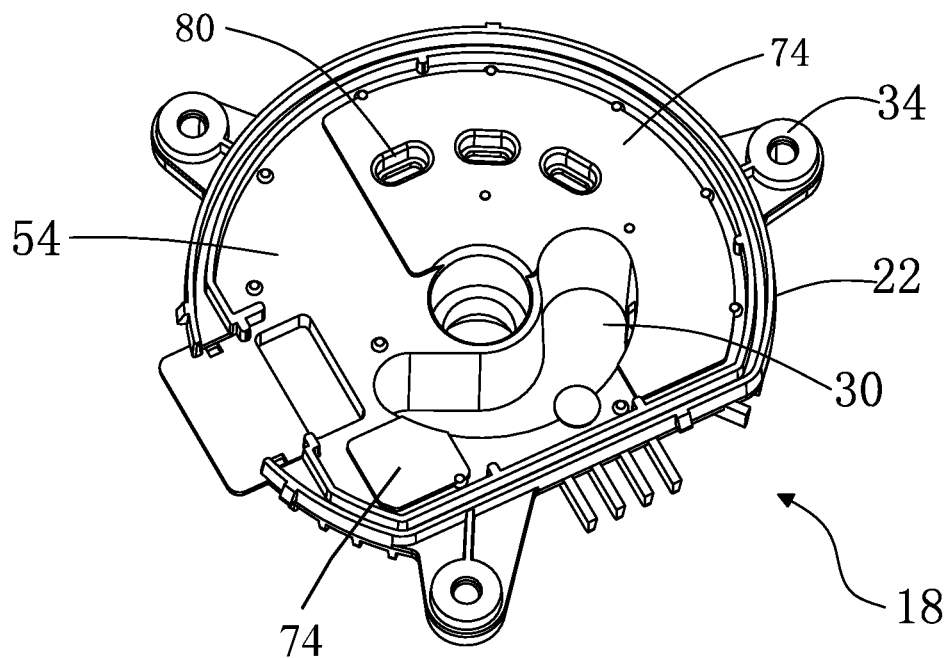
FIG. 5 is a bottom view of the heat sink of FIG. 4, together with a heat conductive sheet and a sealing member.

Referring to FIGS. 4 and 5, the heat sink 18 is preferably made of aluminum alloy, and has a substantially circular heat dissipation plate 22. A bearing housing 24 with a through-hole is formed on the center of the heat dissipation plate 22. A supporting wall 26 is arranged around the bearing housing 24, and the supporting wall 26 may be a continuous ring wall or include some discontinuous arc walls. The outer surface of the supporting wall 26 is uneven and including a plurality of projections. The bearing housing 24 and the supporting wall 26 are partially connected in the circumferential direction via a connecting plate 28, and the radially outer surface of the bearing housing 24, the radially inner surface of the supporting wall 26, and the axial inner surface of the connecting plate 28 together form a housing portion 30 which protrudes into an interior of the stator 12. The housing portion 30 has an opening in the heat dissipation plate 22. A plurality of heat dissipation fins 32 is formed on the heat dissipation plate 22 toward the stator 12 for increasing the heat dissipation area of the heat sink 18. A plurality of circumferentially spaced mounting portions 34 extends outwardly from the heat dissipation plate 22 for mounting of the motor 10.

Figure 6:
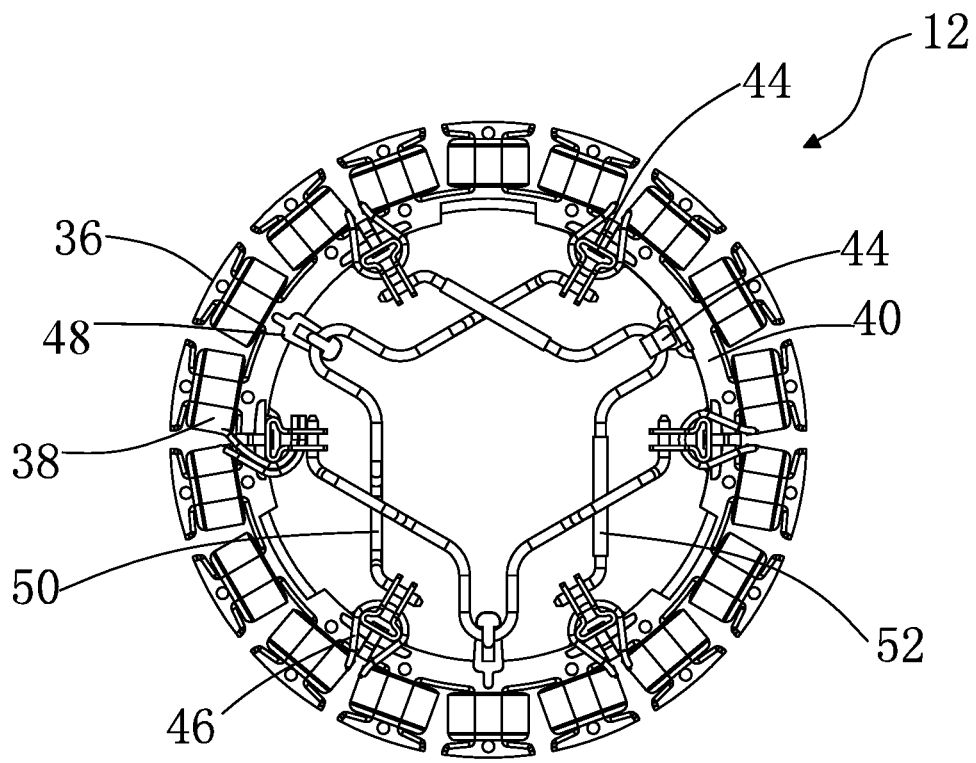
FIG. 6 shows the stator of the motor of FIG. 1.
Figure 7:
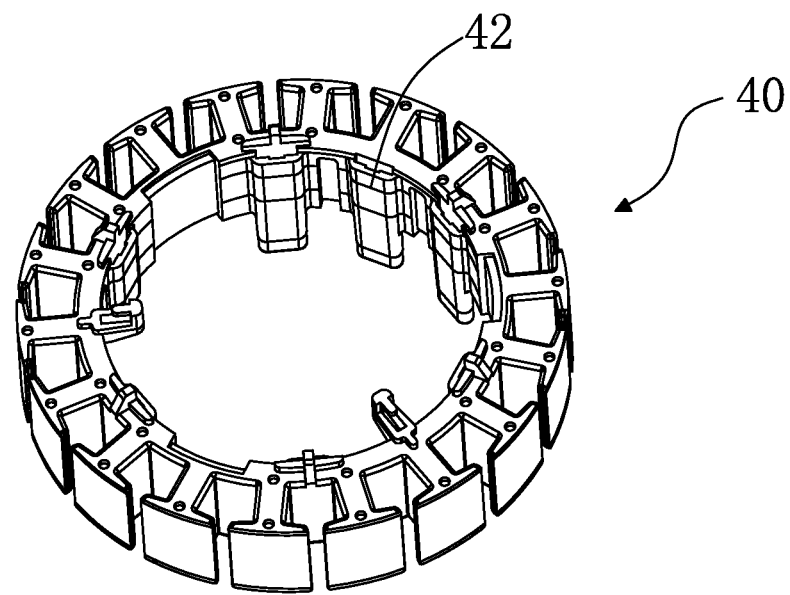
FIG. 7 shows the winding frame of the stator of FIG. 6.
Figure 8:
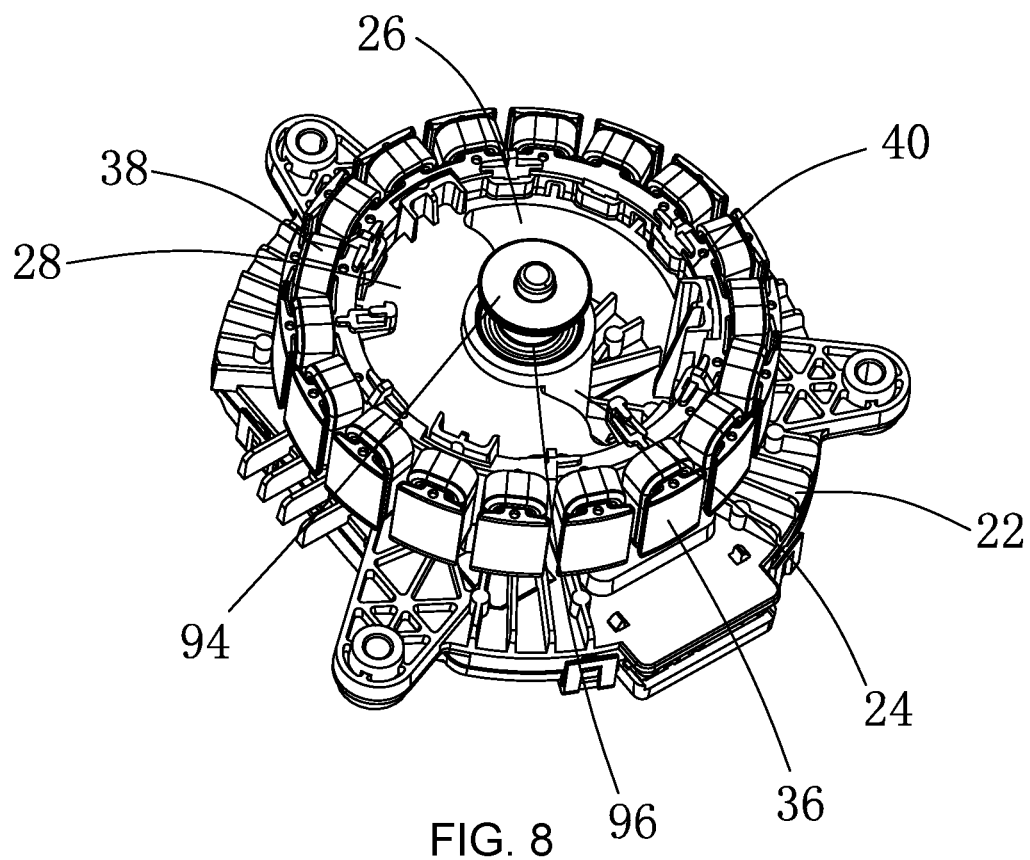
FIG. 8 is an assembled view of the stator and the heat sink of the motor of FIG. 1.

Referring to FIGS. 6-8, the stator 12 includes a stator core 36, stator windings 38, and a winding frame 40. The stator core 36 has a ring-shaped stator yoke and a plurality of stator teeth extending radially outward from the stator yoke. The stator windings 38 are wound around the stator teeth, and the winding frame 40 is disposed between the stator windings 38 and the stator core 36 for electrically insulating therebetween. A plurality of terminal support portions 42 is formed on a radially inner surface of the insulated winding frame 40, and a terminal 44 made of metal is fixedly mounted in a corresponding terminal support portion 42. The terminal 44 can be used to hook a wire 46 of stator windings 38 from one tooth to another tooth and/or a voltage equalization line 50. Three of the terminals 44 are connected to the circuit board 16, and power is supplied from the circuit board 16 to the stator windings 38. Preferably, a heat shrinkable tube 52 wraps around the voltage equalization line 50 to provide insulations between the voltage equalization lines 50 and the heat sink 18. A plurality of hooks 48 is formed on the radially inner surface of the winding frame 40 for facilitating the positioning of the voltage equalization line 50.

In the present embodiment, preferably, the winding frame 40 can be molded on the stator core 36 and the heat sink 18 by injection molding process, so that the heat sink 18 can support the stator core 36. The uneven structure of the outer surface of the supporting wall 26 of the heat sink 18 can make the winding frame 40 and the heat sink 18 form a concave-convex joint, thereby ensuring a reliable connection between the two. The outer surface of the supporting wall 26 of the heat sink 18 is provided with a step-shaped support portions 262 in an axial direction on which the insulated winding frame 40 is put and supported. It will be appreciated that the stator core 36 can also be secured to the heat sink 18 by other means.

A receiving space 54 is defined in a side of the heat dissipation plate 22 away from the stator 12, and the circuit board 16 is received in the receiving space 54 and fixed to the heat dissipation plate 22. The heat dissipation plate 22 is sealingly connected to the cover 20 via a sealing ring 21. It can be understood that the circuit board 16 can also be received in a receiving space formed by the cover 20 or can be fixed to the cover 20.

Figure 9:
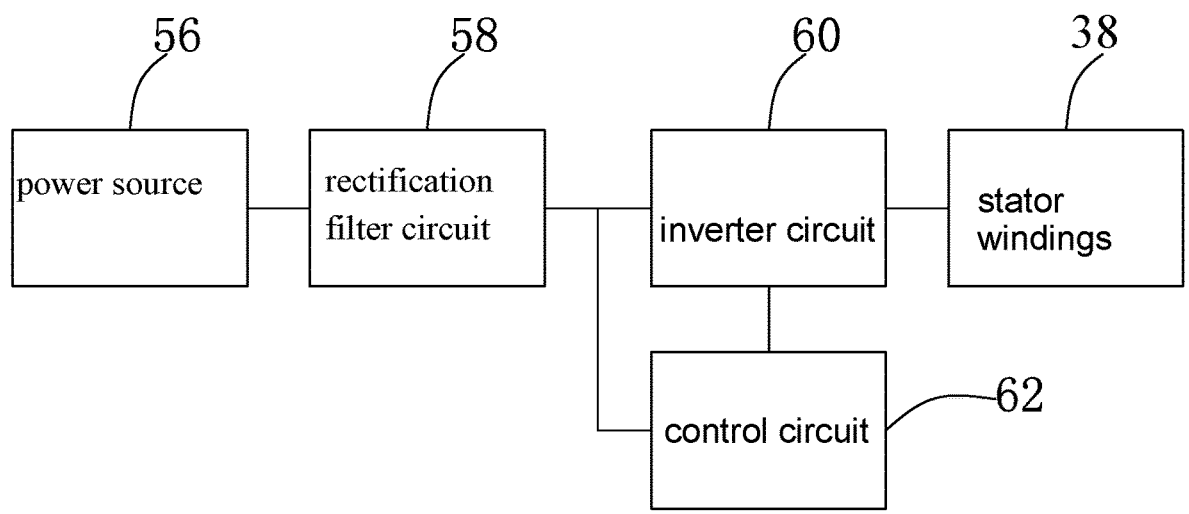
FIG. 9 is a circuit diagram of a driving circuit of the motor of FIG. 1.
Figure 10:
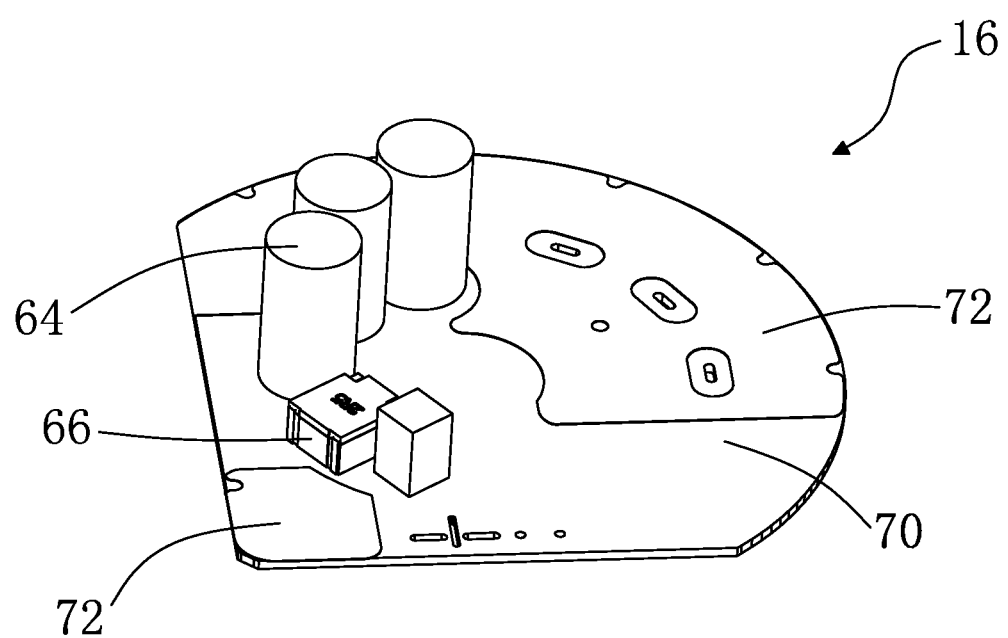
FIG. 10 shows the circuit board of the motor of FIG. 1.
Figure 11:
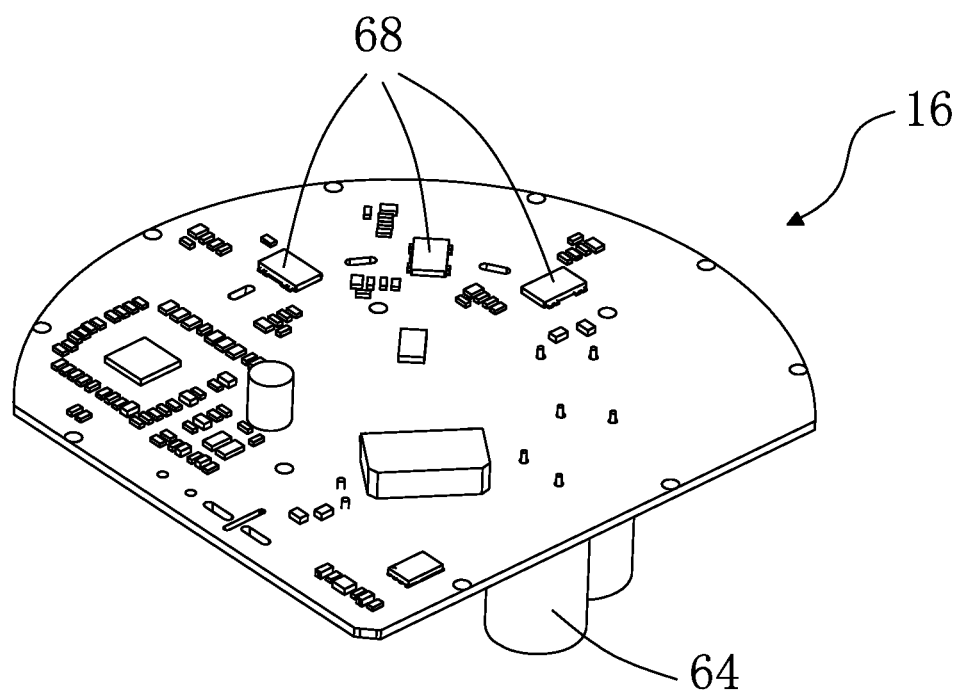
FIG. 11 shows a bottom view of the circuit board of FIG. 10.

Referring to FIGS. 9 to 11, the motor 10 can be powered by an external AC power source 56. A motor drive circuit includes a rectification filter circuit 58, an inverter circuit 60, and a control circuit 62. The external AC power is converted to a stable DC power via the rectification filter circuit 58. Under the control of the control circuit 62, the inverter circuit 60 converts the direct current into an alternating current of a specific frequency to the stator windings 38, thereby generating a rotating magnetic field to drive the rotor 14 to rotate. The rectification filter circuit 58, the control circuit 62, and the inverter circuit 60 are all disposed on the circuit board 16.

In this embodiment, the rectification filter circuit 58 includes at least one large capacity capacitor and a chock inductor 66. The capacitor 64 and the inductor 66 are respectively configured to absorb the bus ripple current, maintain the smoothness of the bus voltage, and constitute an LC low-pass filter, which filters out unwanted signals. Preferably, the capacitor 64 and the inductor 66 are mounted on the side of the circuit board 16 facing the heat dissipation plate 22. One ends of the capacitor 64 and the inductor 66 are mounted to the circuit board 16 and the other ends of the capacitor 64 and the inductor 66 are received in the receiving portion 30 of the heat sink 18. In this embodiment, the motor is an outer rotor motor 10, and the magnetic field is generated radially outside the supporting wall 26 of the heat sink 18. Therefore, the space in the radially inner side of the supporting wall 26 can be fully utilized to accommodate the bulky element (capacitor 64 and inductor 66) on the circuit board. The axial height of the motor can be reduced.

The inverter circuit 60 can be an inverter bridge includes three pairs of switching transistors, which form three bridge arms. Each arm has two switching components, which are N-channel field effect transistors in the embodiment. Preferably, each pair of N-channel field effects transistors is integrated in a semiconductor package 68. In this embodiment, the motor is a three-phase brushless motor. It can be understood that in other embodiments, the motor can also be a single-phase brushless motor. In this embodiment, the inverter circuit 60 can be an H-bridge, including two pairs of N-channel field effects transistors, each pair can be integrated in a semiconductor package. Compared to each transistor in a separate package, the cost is lower, the length of the line connected the two transistors in the circuit board is shortened, the interference caused by the line is also reduced, and the motor operation is more stable and reliable.

Preferably, the switching transistors of the inverter circuit 60 are disposed on the side of the circuit board 16 away from the heat dissipation plate 22, and the circuit board 16 has an insulating region 70 and a metal heat dissipation region 72 on a side facing the heat dissipation plate 22. The metal heat dissipation region 72 is formed on the surface opposite the position of the switching transistors. Preferably, the insulating region 70 is covered by a solder mask such as solder resist ink, and the material of the metal heat dissipating region 72 is nickel gold or tin. The metal heat dissipating region 72 is not cover by the solder mask. A heat conductive sheet 74 is inserted between the metal heat dissipation region 72 and the heat dissipation plate 22. The heat conductive sheet 74 can be made of a mixture of epoxy resin and ceramic powder, and has the characteristics of good electrical insulation and thermal conductivity, and the two sides of the heat conductive sheet 74 are respectively bonded to the metal heat dissipation region 72 and the heat dissipation plate 22.

It will be understood that in other embodiments, the inverter circuit 60 may also be implemented by other known circuits. Similarly, the other main heat generating components of the circuit board 16 can be disposed on the side of the circuit board 16 away from the heat dissipation plate 22, and a metal heat dissipating region is formed at a corresponding position on the other side of the circuit board 16, so that the heat generated by the heat generating components can be dissipated through the metal heat dissipation region 72, the heat conductive sheet 74, and the heat sink 18. The metal heat dissipation region 72 reduces the thermal resistance between the circuit board and the heat sink, thus improving the heat dissipation effect of the circuit board.

Preferably, a plurality of vias (not shown) defining in the metal heat dissipation region 72 extends through the circuit board 16 for guiding the heat of the heat generating components, such as the switching transistors, from one side to the other side of the circuit board.

Preferably, in this embodiment, the motor 10 has only one single circuit board, and the circuit board can adopt a double-layer board or a four-layer board. Preferably, the circuit board is a double-layer circuit board, because two switching transistors of each arm are integrated in one semiconductor package, the number of components and the area of the circuit board can be reduced. Therefore, the two-layer board can also realize the layout of the driving circuit of the motor. And the cost of a two-layer board is lower than that of a four-layer board.

In this embodiment, a connector 76 of the motor 10 can be mounted on the heat sink 18. One end of the terminal of the connector 76 is connected to the external alternating current power source 56, and the other end is soldered to the circuit board 16.

The three terminals 44 penetrate the through holes of the heat sink 18, the heat conductive sheet 74 and the circuit board 16, and are finally fixed to the circuit board 16. A sealing member 80 is disposed in the through hole of the heat dissipation plate 22 and the heat conducting sheet 74 to isolate the terminal 44 from the heat dissipation plate 22 and the heat conductive sheet 74.

Figure 12:
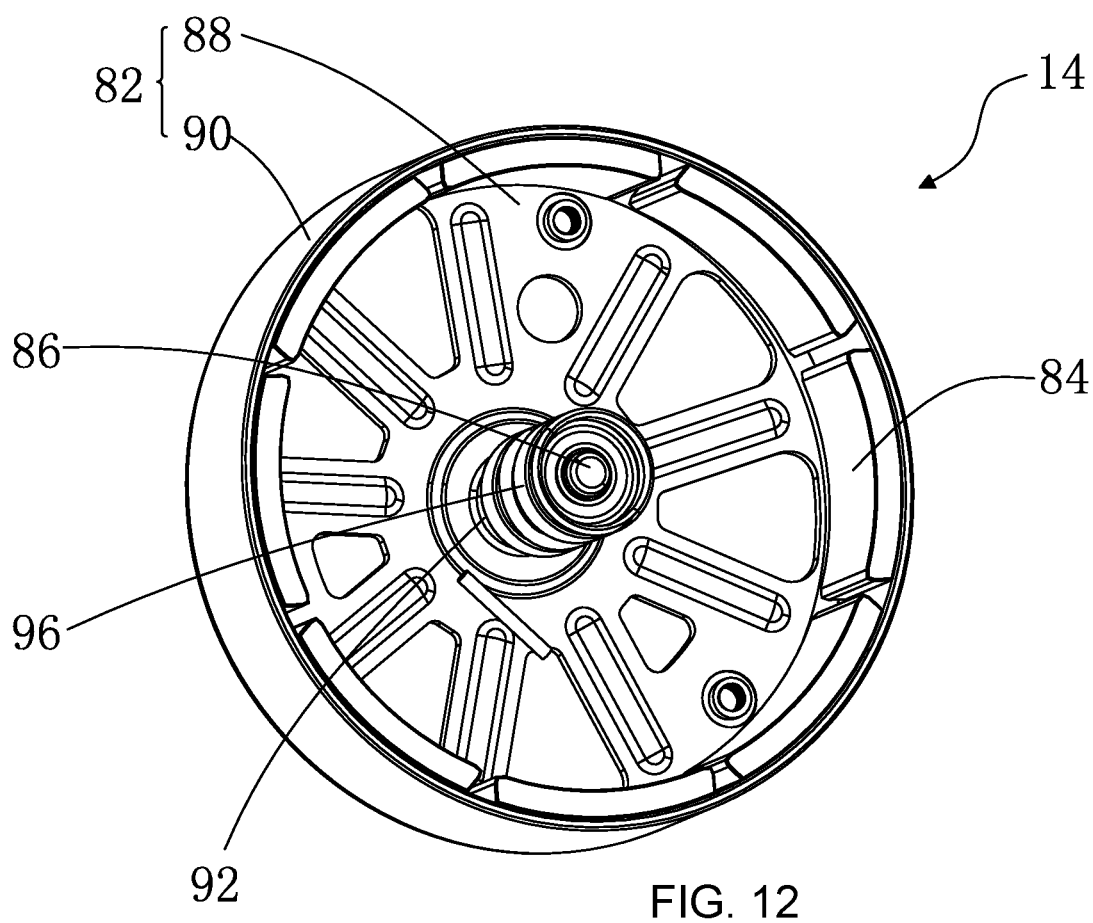
FIG. 12 shows the rotor of the motor of FIG. 1.

Referring to FIG. 12, the outer rotor 14 of the motor 10 includes a rotor housing 82, a plurality of magnets 84 fixed to the rotor housing 82, and a rotating shaft 86. The rotor housing 82 has an end plate 88 and an annular sidewall 90 that extends integrally from the end plate 88 toward the heat sink 18. A plurality of through holes is defined in the end plate 88 for dissipating heat from the motor. The magnets 84 are mounted on the inner surface of the annular sidewall 90, and an air gap is defined between the magnets 84 and the stator core 36. A mounting seat 92 is formed at the center of the end plate 88. A T-shaped bushing 94 is mounted in the mounting seat 92. The rotating shaft 86 is fixed to the rotor housing 82 through the T-shaped bushing 94 and is rotatably supported by the bearing 96 in the bearing seat 24 of the heat sink 18.

In the embodiments of the present disclosure, the metal heat dissipation region under the switching transistors is not covered by the solder ink, a number of vias are defined in the circuit board to guide the heat of the switching transistors from a top layer to a bottom layer. The characteristics of good thermal conductivity of the metal is fully utilized, the circuit board is tightly bonded to the heat sink by the heat conductive sheet 74. Thus, the thermal resistance from the switching transistors to the heat sink is greatly reduced. Therefore, the required heat sink area and volume are reduced, resulting in a reduction in the volume of the entire motor, thereby increasing the power density of the motor, reducing the weight of the motor, simplifying the structure and assembly of the motor, and improving product reliability.

The external rotor three-phase brushless DC motor in the above embodiments is described as an example. It can be understood that the application is not limited thereto. For example, the motor may also be an inner rotor motor, or a brush motor, or a single-phase motor.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. A motor comprising a stator, a rotor rotatable relative to the stator, a circuit board fixed to the stator, and a heat sink disposed on the circuit board, a side surface of the circuit board facing the heat sink comprising an insulating region and a metal heat dissipation region without solder mask.

2. The motor according to claim 1, wherein the material of the insulating region is solder resist ink, and the material of the metal heat dissipation region is nickel gold or tin.

3. The motor according to claim 1, wherein the circuit board is a two-layer circuit board or a four-layer circuit board, and the circuit board comprises an inverter circuit, and the inverter circuit comprises a plurality of switching transistors, the plurality of switching transistors are mounted on a side surface of the circuit board opposite to the side surface facing the heat sink, and the metal heat dissipation region is under the plurality of switching transistors.

4. The motor according to claim 2, wherein a heat conducting sheet is disposed between the heat sink and the metal heat dissipation region of the circuit board.

5. The motor according to claim 1, wherein the circuit board comprises an inverter circuit, the inverter circuit comprising at least two pairs of switching transistors, and each pair of the switching transistors is integrated in one semiconductor package.

6. The motor according to claim 1, wherein the stator core is fixed to the heat sink via an injection molded member.

7. The motor according to claim 1, wherein the motor is an outer rotor brushless motor, a bearing of the motor is supported by the heat sink, and the stator and the circuit board are respectively disposed on two sides of the heat sink.

8. A motor comprising a stator, a rotor rotatable relative to the stator, and a circuit board fixed to the stator, the circuit board comprising at least one capacitor and/or an inductor, one end of the at least one capacitor and/or the inductor being mounted to the circuit board, the other end of the capacitor and/or the inductor extending into an interior of the stator so as to overlap windings of the motor in an axial direction.

9. The motor according to claim 8, wherein the motor comprises a heat sink fixed to the stator, the heat sink has a heat dissipation plate, a bearing housing is formed on the heat dissipation plate, a supporting wall configured for supporting the stator is arranged around the bearing housing, the bearing housing and the supporting wall are partially connected in the circumferential direction through a connecting plate, the radially outer surface of the bearing housing, the radially inner surface of the supporting wall, and the axial inner surface of the connecting plate together form a housing portion with the at least one capacitor and/or the inductor received therein, and the housing portion protrudes into an interior of the stator.

10. A motor comprising a stator, a rotor rotatable relative to the stator, a circuit board fixed to the stator, and a heat sink disposed on the circuit board, a side surface of the circuit board facing the heat sink comprising an insulating region and a metal heat dissipation region without solder mask, wherein at least one capacitor and/or an inductor are mounted on the circuit board, one end of the at least one capacitor and/or the inductor is mounted to the circuit board, the other end of the at least one capacitor and/or the inductor extends into the stator and overlaps with stator windings in an axial direction.

11. The motor according to claim 10, wherein the heat sink comprises a receiving portion that extends into an interior of the stator, and the at least one capacitor and/or the inductor are received in the receiving portion.

* * * * *